United States Patent

[11] 3,614,772

[72] Inventors T. O. Paine
Deputy Administrator of the National Aeronautics and Space Administration with respect to an invention of;
Wallace R. Finley, Albuquerque, N. Mex.;
Jay A. Cox, Rolling Hills, Calif.

[21] Appl. No. 23,132
[22] Filed Mar. 27, 1970
[45] Patented Oct. 19, 1971

[54] ANALOG-TO-DIGITAL CONVERTER
2 Claims, 1 Drawing Fig.

[52] U.S. Cl. .......... 340/347 AD
[51] Int. Cl. .......... H03k 13/04
[50] Field of Search .......... 340/347; 235/154

[56] References Cited

UNITED STATES PATENTS

| | | | |
|---|---|---|---|
| 3,021,517 | 2/1962 | Kaenel | 340/347 |
| 3,340,526 | 9/1967 | Sugarman | 340/347 |
| 3,438,024 | 4/1969 | Smith | 340/347 |

OTHER REFERENCES

Grabbe et al., (Ed.), Handbook of Automation Computation & Control, J. Wiley & Sons, New York, 1959, pp. 22- 08, 22- 09. Copies included

*Primary Examiner*—Maynard R. Wilbur
*Assistant Examiner*—Jeremiah Glassman
*Attorneys*—Marvin J. Marnock, Marvin F. Matthews and G. T. McCoy

ABSTRACT: An analog-to-digital converter which utilizes an offset voltage to eliminate problems of offset errors, the conversion being performed on the ratio of the unknown analog signal to the offset voltage.

PATENTED OCT 19 1971
3,614,772
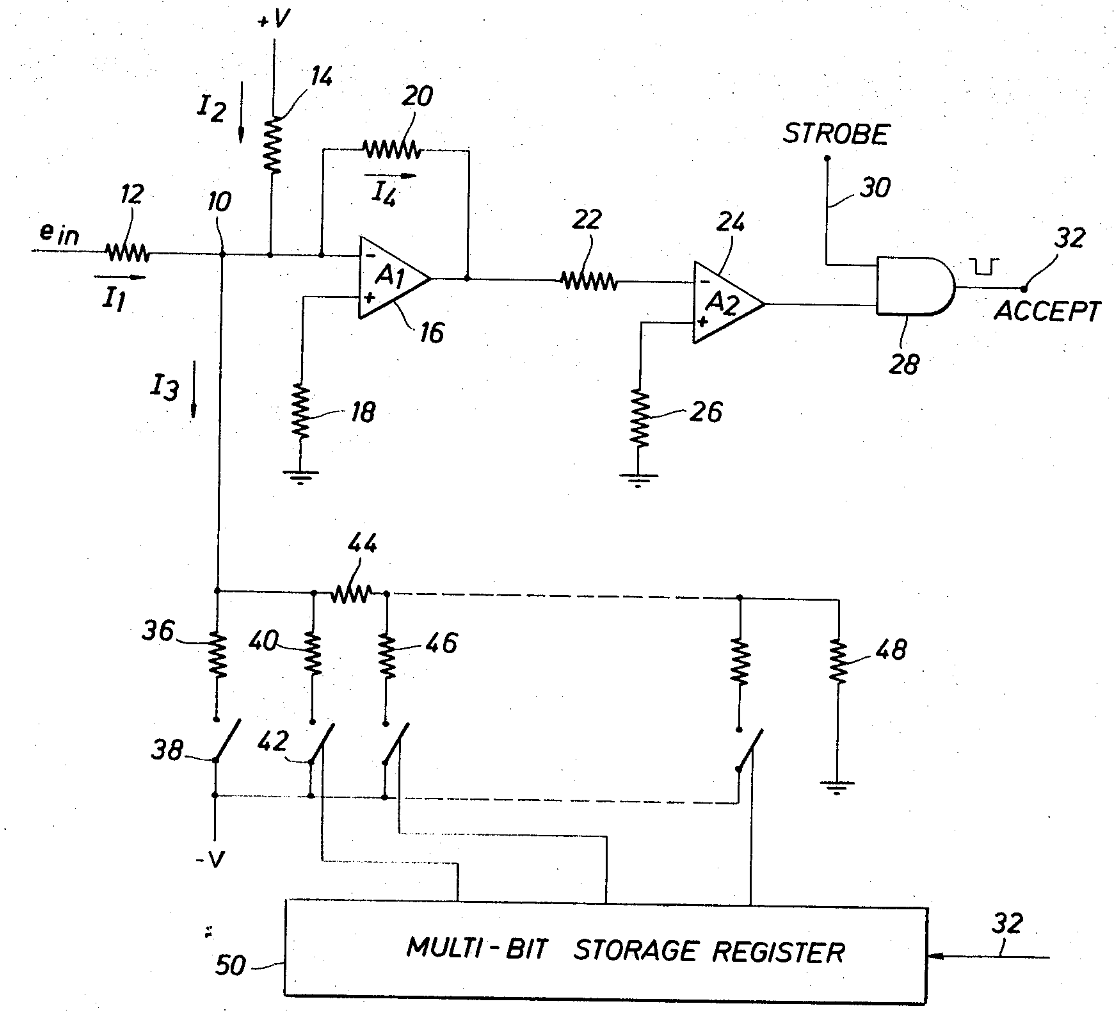
Wallace R. Finley
Jay A. Cox
INVENTORS
BY M. J. Marnock
ATTORNEYS

ANALOG-TO-DIGITAL CONVERTER

The invention described herein was made in the performance of work under a NASA Contract and is subject to the provisions of Section 305 of the National Aeronautics and Space Act of 1958, Public Law 85–568 (72 Stat. 435; 42 U.S.C. 2457).

SUMMARY OF PROBLEM AND INVENTION

In the use of analog to digital converters, the amount of error normally found in the apparatus is in part a function of the switch closure contact in the resistive ladder network. The apparatus of the present invention provides a very high degree of sensitivity and linearity through the use of an apparatus which eliminates offset errors such as those arising from the noted source. The apparatus of the present invention utilizes an offset voltage source working through a resistor to a summing junction whereby the input variable is compared against the offset voltage, and a ratio between the two is obtained. The apparatus responds to the input ratio in a manner to cancel offset errors. Hence, the apparatus is quite linear in operation.

The invention is summarized as including an input junction at which four currents are summed. A current is derived from the input variable through a standard resistive value. A positive offset voltage is likewise supplied to the junction through another standard resistive value. The ladder network is connected to the same junction to provide the reconstructed analog value to the junction. An operational amplifier having a resistive feedback loop is likewise connected to the summing junction. The operation amplifier is driven in one direction or the other to form an output voltage, and hence, current flow in the resistive feedback network is the fourth current flowing at the summing junction. A balance is obtained through operation of the amplifier. As the amplifier is driven in one direction or the other, it departs from its normal or quiescent condition. An output comparator circuit forms a positive or negative signal indicative of a digitized portion of the input signal, the most significant bit being formed first, and other bits being formed thereafter.

While the foregoing has been directed to a summary of the preferred embodiment and sets forth the problem to be solved by the apparatus of the present invention, a more complete understanding of the present invention will be obtained from a consideration of the included drawings and specification wherein:

The single drawing illustrates the preferred embodiment of the present invention is schematic block diagram form.

In the single drawing, the numeral 10 indicates a summing junction as will be discussed in describing the general theory of operation of the analog to digital converter of the present invention. Briefly, an input current through a resistor 12 is derived from the unknown voltage to be digitized. An offset voltage is applied to the summing junction 10 and creates a second input current to the junction which adjusts the operative range of the apparatus and provides an offset against certain error-producing currents as will be discussed. A third current flows at the junction 10 as a result of the resistive ladder. A fourth current flowing at the junction 10 is a consequence of the junction voltage input to an operational amplifier having a resistive feedback circuit. The output voltage of the amplifier has a polarity opposite to that of the summing junction voltage, and hence, the feedback loop creates an additional current flow. As will be recognized, the current flow into the junction is equal to the current flow out of the junction, and hence, a balance is achieved. The operational amplifier is driven in such a manner as to create one bit of the digitized value of the analog signal. More will be noted concerning the apparatus of the present invention hereinafter.

In the drawings, the numeral 14 indicates a resistive component connected with a voltage source. Preferably, the resistors 12 and 14 have equal values and will be termed as standard resistors hereinafter. The standard resistor is used repetitively in the reconstructive network as will be described. The input voltage is typically a signal voltage near ground potential, and for purposes of description, may be assumed to be between minus 10 volts and plus 10 volts. The positive supply connected with the resistor 14 is preferably well regulated at 20 volts. The offset supplied by the positive supply leaves the apparatus operating in the positive range, and hence, the encoded digitized value is in an offset binary format.

An operational amplifier 16 is connected to the summing junction 10. Preferably, a differential amplifier is utilized wherein one input terminal is connected with a resistor 18 which is connected with a convenient reference source, the preferred embodiment using ground potential. The operational amplifier 16 includes a feedback loop having a resistive element 20. The resistor 20 may have any value desired, but it is preferably selected to minimize current drain from the junction 10 while yet providing a degree of feedback around the amplifier. The output of the amplifier is connected through a series resistor 22 to a comparator amplifier 24. The amplifier 24 is provided with two inputs, and the second input is connected through a resistor 26 to a convenient level, such as ground, for purposes of comparison. The amplifier 24 provides an output to an AND gate 28 which is triggered by an appropriate timed signal on a conductor 30 to create an output signal on a conductor 32. The signal on the conductor 32 is one bit of the digital word formed by the apparatus of the present invention.

In the operation of the converter of the present invention, the apparatus reconstructs the analog value through a resistive ladder network. A resistor 36 in series with a switch 38 reconstructs a portion of the analog value. In this case, it reconstructs the most significant bit of the digital word. As will be described, this is the sign of the digital word or the analog value. The second resistor in the network reconstructs the next most significant bit. The resistor 40 is in series with the switch 42, and when the switch is closed, contributes sufficient current flow to the summon junction 10 to reconstruct the next most significant bit. The numeral 44 indicates a resistor providing interconnection with additional stages of the reconstructive ladder network which further includes a resistor 46 in series with an appropriate switch, and so on. The circuitry preferably includes one resistor and appropriate series switch for each bit in the digital word representing the analog value. The resistive ladder network is tied to a suitable negative value, in this case minus 10 volts, because this represents the maximum negative analog value which can be digitized by the preferred embodiment. Clearly, this value will be altered should it be desired to digitize different voltage ranges. The resistive ladder network is likewise grounded through a resistor 48.

In accordance with known analog to digital converter theory, the resistors 36 and 44 are of the standard value, whereas the resistors 40, 46 and 48 are twice the standard resistive value. As will be understood, the several additional stages of the resistive ladder network repeat the same values.

In the reconstruction of the analog value, each of the resistors 36, 40, 46 and so on, are controllably switched into the resistive network. Such switching is controlled by the switches indicated in the drawings. It is immaterial whether the switches are mechanical in construction or electronic in operation, it being understood that high-speed operation of the A to D converter is best achieved through the use of electronic switching.

As will be understood from conventional analog to digital converter operation, the reconstruction achieved by the ladder network corresponds to the value of the digital word. Thus, should the input analog value be the maximum permitted for linear operation of the A to D converter, the output digital word would be all "ones" without regard to length of the digital word. In this case, the switches are closed connecting the resistors in the ladder network and each resistor then contributes a portion to the current flow at the summing junction 10. Reconstruction is achieved whereby the $n$th significant bit of the digital word closes the switch with the $n$th resistor in the ladder network if the digitized value is a one. If the digitized value is a zero, that switch is left open. Hence, the numeral 50 indicates a multibit storage register which accumulates the several bits of information and which is also connected with the resistive ladder network to control the status of the switches in the network. The conductor 32 is the input for the multibit storage register 50 so that the several bits of the digital word are received for storage.

The foregoing has described the components and their connection, but it should be considered in operation to enhance the understanding thereof. Several exemplary values are listed in the following table.

| Input Voltage | Digitized Value |
|---|---|
| +10 | 1111111111111 |
| +LSB | 1000000000001 |
| 0 | 1000000000000 |
| −LSB | 0111111111111 |
| +10 | 0000000000000 |

In the foregoing table, the term LSB indicates the least significant bit. In the preferred embodiment, which can range from plus to minus 10 volts input, a 13-bit converter provides a resolution of 2.44 millivolts. Of course, if the number of bits is varied, the resolution will be changed from the suggested value.

Consider operation of the converter when the input is the maximum, or exactly 10 volts, as described in the preferred embodiment. The input signal is applied to the summing junction 10 which drives the junction relatively positive at the input terminal of the operational amplifier 16. This drives the output of the amplifier 16 negative. This negative going signal is inverted by the comparator 24 which provides a positive going output signal or a "one" input for the AND gate 28. This one then represents the sign bit of the digitized word. The sign bit is stored, and being a one, causes the gate 38 to be closed connecting the resistor 36 in the resistive ladder network. The resistor 36 then contributes a sufficient current flow to the summing junction 10 to enable the continued reconstruction of the analog value.

The next step is a formation of the next most significant bit. In the assumed example, the junction 10 remains positive at the input of the operational amplifier 16 which forms a negative output. The comparator 24 inverts the negative output to provide a "one" input for the gate 28. When the enable pulse is provided on the conductor 30, the gate 28 provides a one output which is then stored in the multibit storage register 32. The stored value causes the switch 42 to close and the resistor 40 is then connected in the resistive network for further reconstruction of the analog value. As the resistor 40 is switched into the circuitry, the current contribution of the resistor 40 pulls the voltage at the summing junction 10 down inasmuch as the resistor 40 is connected to a negative supply. Hence, this is a reconstructive step which enables the apparatus to proceed to the next most significant bit, which is processed in the same manner. The procedure is continued until the least significant bit (LSB) is digitized. When the analog value is reconstructed, it is stored in the register and the digital word is completed. At this juncture, the resistive ladder network contributes sufficient current flow to the summing junction 10 to approximately null out any driving signal for the operational amplifier 16. The digital word is then ready for transfer to circuitry cooperative with an analog to digital converter, and the register 50 may be cleared and the switches reset in the resistive ladder network to prepare the circuitry for digitizing the next analog value.

The operation rate of the apparatus is of internest. The analog value input to the converter is preferably held steady by suitable circuits such as a sample and hold amplifier or the like. Of course, the voltage need only be held for a few microseconds. The analog value, once input, is digitized in rapid order. The response time of the amplifiers 16 and 24 is of small significance. The strobe source 30 preferably runs at a cycle rate of perhaps 20 microseconds to permit the various circuit components to settle after switching. This cycle rate allows the digitized value to be transferred on the conductor 32 to the storage register 50, the appropriate switch in the resistive ladder network is operated and the value at the summing junction 10 is allowed to settle during the 20 microsecond cycle. It is possible to run the apparatus somewhat faster if desired.

The foregoing has been directed to the preferred embodiment of the present invention, which has been described as cooperative with a range of 20 volts, centered on ground potential. Of course, other arbitrary limits may be imposed on the apparatus. Such limitations should not be imposed on the inventive concept herein described inasmuch as the above limitations were found in the preferred embodiment only.

The foregoing has been directed to the preferred embodiment. The descriptive phrases and terminology adapted herein are likewise applied to the claims which are appended hereto.

What is claimed is:

1. An analog to digital converter for converting a bipolar analog voltage to a unipolar offset digital value, said converter comprising:

a. a resistor ladder network;
b. an input terminal for supplying an analog voltage to be digitized;
c. a reference voltage source communicated with said input terminal for adding thereto a voltage for offsetting the input analog voltage, said reference voltage being of sufficient value to shift the voltage at said input terminal to a value exceeding ground potential;
d. differential operational amplifier means connected to receive the resulting voltage at said input terminal as its first input and a fixed reference voltage as its second input, said amplifier means being responsive to be driven in a positive or negative direction from a quiescent condition in forming one bit of of the digitized value of the input analog voltage;
e. feedback resistor circuit means connected across the operational amplifier means and communicated with said input terminal for supplying current flow thereto;
f. comparator circuit means having a first comparator input terminal with the output of said operational amplifier means and a second comparator input terminal communicated with a standard voltage source for comparing the output voltage from said operational amplifier means therewith, said comparator circuit means forming a positive going pulse to indicate the presence of a positive voltage input to said operational amplifier means;
g. output gate means periodically enabled with an enable signal and cooperative with said comparator means for forming the digital bits corresponding to the digitized value of the input analog voltage;
h. a source of negative voltage adapted to be coupled to the resistors of said ladder network; and
i. switching means responsive to said digital bits for controllably coupling said source of negative voltage to said input terminal through selective resistors of said resistor ladder network.

2. The invention of claim 1 including multibit storage register means for storing in digital binary formate the presence or absence of output pulses at said output terminal being communicated through a suitable impedance value for contributing a first current flow to said input terminal, and said reference voltage source contributing a second current flow to said terminal, said ladder network means contributing a third current flow thereto and said feedback circuit means providing a fourth current flow to the junction provided at said input terminal to balance the currents thereto when the output of said amplifier circuit means goes positive or negative.